US009898044B2

(12) United States Patent
Huang

(10) Patent No.: US 9,898,044 B2
(45) Date of Patent: Feb. 20, 2018

(54) DOCKING STATION AND MOBILE TERMINAL WITH THE SAME

(71) Applicants: NANNING FUGUI PRECISION INDUSTRIAL CO., LTD., Nanning (CN); HON HAI PRECISION INDUSTRY CO., LTD., New Taipei (TW)

(72) Inventor: Ying-Jui Huang, New Taipei (TW)

(73) Assignees: NANNING FUGUI PRECISION INDUSTRIAL CO., LTD., Nanning (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/484,262

(22) Filed: Apr. 11, 2017

(65) Prior Publication Data

US 2017/0344062 A1 Nov. 30, 2017

(30) Foreign Application Priority Data

May 31, 2016 (TW) ............................ 105116979 A

(51) Int. Cl.

| | |
|---|---|
| ***G06F 1/16*** | (2006.01) |
| ***H05K 7/14*** | (2006.01) |
| ***H01R 13/453*** | (2006.01) |
| *H05K 7/00* | (2006.01) |
| *H05K 5/00* | (2006.01) |

(52) U.S. Cl.

CPC ......... *G06F 1/1632* (2013.01); *H01R 13/453* (2013.01); *H05K 7/1401* (2013.01); *G06F 2200/1639* (2013.01)

(58) Field of Classification Search

CPC ........................................................ H05K 5/02
USPC ..................................................... 361/679.21
See application file for complete search history.

(56) References Cited

U.S. PATENT DOCUMENTS

| | | | | |
|---|---|---|---|---|
| 6,870,730 B2 * | 3/2005 | Riddiford | ............ | G06F 1/1616 248/917 |
| 8,030,889 B2 * | 10/2011 | Tamura | ................ | G06F 1/1632 320/107 |
| 8,644,018 B2 * | 2/2014 | Hung | .................... | G06F 1/1632 16/302 |

FOREIGN PATENT DOCUMENTS

| | | |
|---|---|---|
| CN | 101093404 B | 7/2011 |
| CN | 102445956 A | 5/2012 |
| EP | 2778829 A3 | 9/2014 |
| TW | 201015272 | 4/2010 |
| TW | 201412221 A | 3/2014 |
| TW | 201505279 A | 2/2015 |

* cited by examiner

*Primary Examiner* — Jerry Wu
(74) *Attorney, Agent, or Firm* — ScienBiziP, P.C.

(57) ABSTRACT

The disclosure provides a docking station and a mobile terminal with the docking station. The docking station includes a docking main body, a shelter, a first link mechanism, a second link mechanism and a moveable locking bar. The shelter shields the connector and the moveable locking bar is stayed in an unlocked position when the docking station is free. When the mobile terminal is coupled with the docking station, the first link mechanism is driven by the mobile terminal, the shelter is forced to rotate to a predetermined storage position, and the second link mechanism drives the moveable locking bar to a locked position to lock the mobile terminal. The docking station is easy to use with simple process of assembly and adjustment.

23 Claims, 12 Drawing Sheets

DOCKING STATION AND MOBILE TERMINAL WITH THE SAME

FIELD

The subject matter herein generally relates to electronic devices, and more particularly to a docking station and mobile terminal with the same.

BACKGROUND

A docking station is a base to expand the functionality of mobile terminals. The docking station is used to connect external devices such as a driver, a large screen monitor, a keyboard, a printer, a scanner, or the like through an interface or insert slot. The docking station connected to the external devices can fulfill more expanded functions the external devices defects. The most common structure of the docking station needs an enclosure or manually to adjust or align when placing the mobile terminal, and the docking station has a bad experience in operation, further easily to cause scratch for mobile terminal or damage to connecting port because of improper installation.

BRIEF DESCRIPTION OF THE DRAWINGS

Implementations of the present technology will now be described with reference to the attached figures.

DETAILED DESCRIPTION

Figure 1:
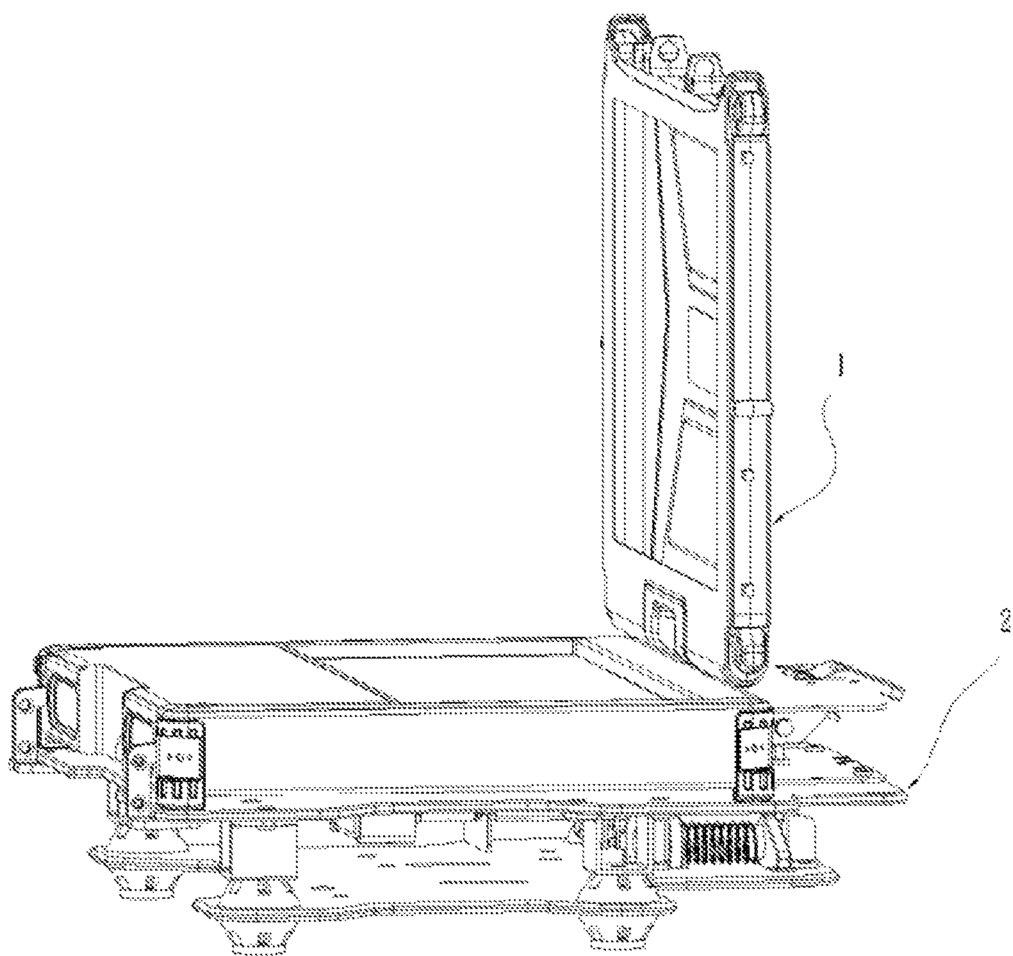
FIG. 1 is an isometric view of an assembled structure of an exemplary embodiment of a docking station and a mobile terminal.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts have been exaggerated to illustrate details and features of the present disclosure better.

The disclosure is illustrated by way of example and not by way of limitation in the figures of the accompanying drawings in which like reference numerals indicate the same or similar elements. It should be noted that references to "an" or "one" exemplary embodiment in this disclosure are not necessarily to the same exemplary embodiment, and such references can mean "at least one".

FIG. 1 shows an exemplary embodiment of an assembled structure for a docking station 2 and a mobile terminal 1. The mobile terminal 1 is assembled on a docking station upper portion and electrically connected to the docking station 2. Thereby realizing the function expansion of the mobile terminal 1 and convenient for securing the mobile terminal 1.

Referring to FIG. 2 to FIG. 5, the docking station 2 includes a main body 10, a shelter 20, a first link member 30, a second link member 40, a first link mechanism 50 and a second link mechanism 60. The main body 10 includes a base 110, an expansion interface (not shown) formed on the base 110, a connector 120, a positioning clip 130 connected to a base upper side, and a movable latch 140 mounted on the base 110 relative to the positioning clip 130. The connector 120 is electrically connected to the mobile terminal 1 and the expansion interface (not shown). The positioning clip 130 is mounted on the base 110. The movable latch 140 can be switched in locked and unlocked states. The movable latch 140 remains unlocked state when the docking station 2 is not placed in the mobile terminal 1. When a mobile terminal first side is inserted into the docking station 2 from the positioning clip 130, the mobile terminal 1 is secured on the docking station 2 by the positioning clip 130, and a mobile terminal second side is locked by the movable latch 140.

A shelter first end and a shelter second end are separately and rotatably connected to a connector first side and a connector second side by the first link member 30 and the second link member 40. In the disclosure, the shelter 20 may be provided in the form of a baffle, when the mobile terminal 1 is not placed in the docking station 2, the shelter 20 is above the connector 120 to prevent the connector 120 from damaged because of scratch.

A first link mechanism first end is in contact with a mobile terminal lower portion and driven by the gravity of the mobile terminal 1. A first link mechanism second end is connected to a first link member first side and drives the first link member 30 to rotate.

A second link mechanism first end is in contact with a second link member first side and driven by the second link member 40. A second link mechanism second end is connected to the movable latch 140 and drives the movable latch 140 switched into locked and unlocked states.

Figure 4:
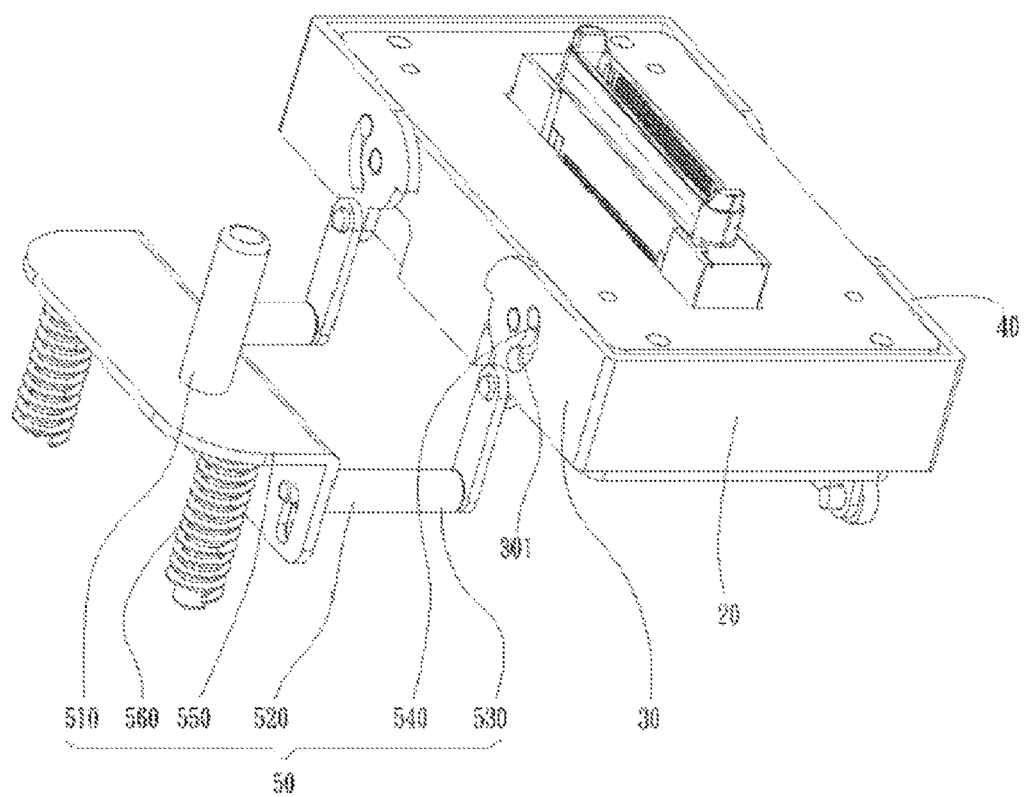
FIG. 4 is an isometric view showing the first link mechanism with a shelter in FIG. 2.

When the docking station 2 is not connected to the mobile terminal 1, the shelter 20 is above the connector 120 to prevent the connector 120 from damaged because of scratch, and the movable latch 140 is in the unlocked state. Referring to FIG. 4, when the mobile terminal 1 is not placed in the docking station 2, the first link mechanism 50 drives the first link member 30 to rotate under the gravity of the mobile terminal 1, and the first link member 30 drives the shelter 20 to rotate to a predetermined receiving position of the connector first side to make the connector 120 exposed. The mobile terminal 1 is electrically connected to the exposed connector 120. The shelter 20 drives the second link member 40 to rotate, and the second link member 40 drives the second link mechanism 60 to lock with the movable latch 140, the mobile terminal 1 is locked by the positioning clip 130 and the movable latch 140 together. The mobile terminal 1 is placed in the docking station 2 without any manual operation, which is simplifying in assembling process and improving the usability of the docking station 2.

Figure 2:
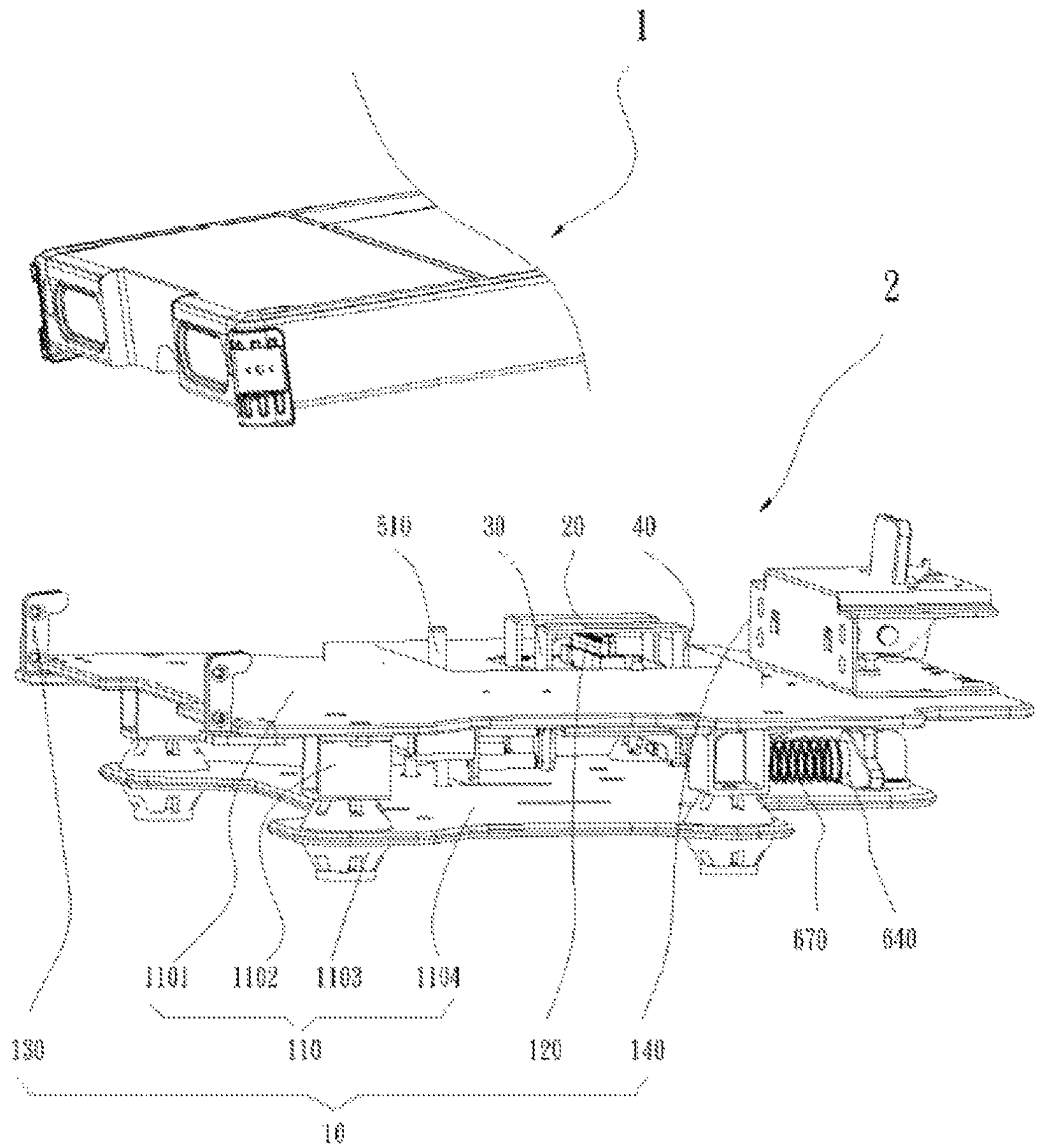
FIG. 2 is a disassembled isometric view of the docking station and the mobile terminal in FIG. 1.

Referring to FIG. 2, in this exemplary embodiment, the base 110 includes a first support plate 1101, and a second support plate 1104 disposed below the first support plate 1101 in parallel. The first support plate 1101 and the second support plate 1104 is secured by a plurality of support rods 1102 to form a receiving space. The second support plate 1104 below is provided with a plurality of legs 1103 higher than the ground level for waterproof and heat dissipation.

In an embodiment, the first link mechanism 50 and the second link mechanism 60 is disposed in a receiving space between the first support plate 1101 and the second support plate 1104. The connector 120 is mounted on a first support plate upper portion to connect with the mobile terminal 1. Meanwhile, a contact member is disposed on a first link mechanism first side. The contact member extends from a contact hole on the first support plate 1101 and through the contact hole to touch with the mobile terminal 1. In this exemplary embodiment, the contact member is an elevator rod 510.

In order to prevent liquid from splashing onto the connector 120, an elastic washer (not shown) may be provided on the first support plate upper portion after the mobile terminal 1 is connected to the docking station 2. The elastic washer is around the connector 120, the mobile terminal 1 comes into close contact with the upper surface of the elastic washer, and the connector 120 is enclosed between the elastic washers prevent liquid from splashing onto the connector 120.

Figure 3:
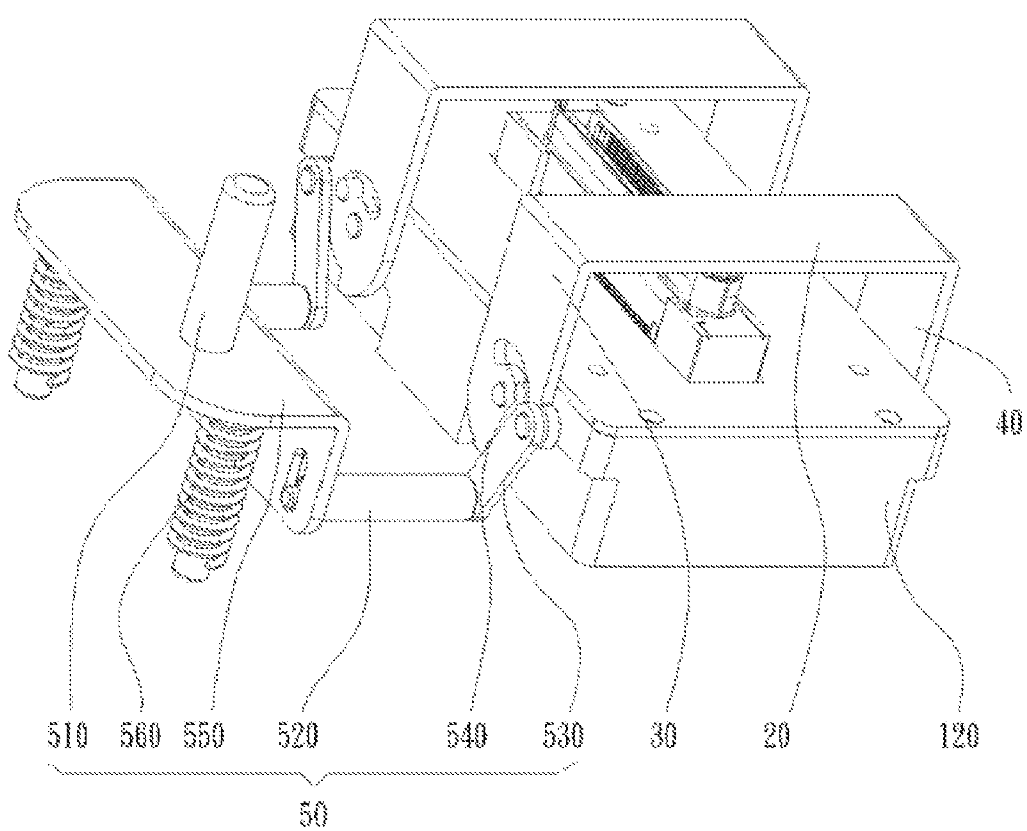
FIG. 3 is an isometric view of a first link mechanism in FIG. 2.

FIGS. 3 and 4 show an exemplary embodiment of the first link mechanism 50. In a specific implementation, the first link mechanism 50 includes the elevator rod 510, a first link shaft 520 and a rocker 530. The elevator rod 510 having an elevator rod upper end contacted with the mobile terminal 1 is driven by the gravity of the mobile terminal 1. The first link shaft 520 with a first link shaft first end vertically connects to the elevator rod 510 and moves up and down following the elevator rod 510. The rocker 530 with a rocker first end connects to a first link shaft second end, and a rocker second end far away from the first link shaft 520 is hinged to a first link member first end. The base 110 having a sliding hole (not shown) is engaged with an elevator rod bottom end, an elevator rod lower portion moves up and down in the sliding hole and is guided by the sliding hole.

When the elevator rod 510 is moved downward, the elevator rod 510 drives the first link shaft 520 to fall. The first link shaft 520 drives the rocker 530 to swing, and the rocker 530 promotes the first link member 30 to rotate to bring the shelter 20 to rotate to a predetermined receiving position, and the connector 120 is exposed out to connect with the mobile terminal 1.

As an exemplary embodiment, the middle of the first link member 30 has a first link member sliding slot 301 to engage with a sliding block 540 on the connector first side, when the rocker 530 promotes the first link member 30 to rotate, the sliding block 540 is moved along with the sliding slot 301 to make the shelter 20 to be stably received.

In another exemplary embodiment, the first link mechanism 50 comprises a baffle 550 and a first elastic member 560. The baffle 550 is vertically passed through by the elevator rod 510 and secured to the elevator rod 510. The first link shaft first end is vertically connected to the elevator rod 510 through the baffle 550. The first elastic member 560 is placed over the elevator rod 510 and is buckled between the baffle 550 and a base upper portion. The first elastic member 560 is preferably a spring. In the specific exemplary embodiment, the elevator rod 510 is a straight bar. An elevator rod first end extends out from a baffle top side and butt jointed with the mobile terminal lower portion, and an elevator rod second end protrudes downwardly from the baffle 550. As shown in FIG. 3, the elevator rod 510 positioned on a baffle lower side may be provided with two straight bars, so that the elevator rod 510 is more stable in its vertical movement. The two straight bars are separately placed over a spring.

When the mobile terminal 1 is assembled to the docking station 2, the elevator rod 510 is driving by the gravity of the mobile terminal 1. The elevator rod 510 drives the baffle 550 moving downward, and the shelter 20 rotates to a predetermined receiving position through the first link shaft 520, the rocker 530 and the first link member 30. The first elastic member 560 is compressed. When the mobile terminal 1 is disassembled from the docking station 2, the first elastic member 560 drives the baffle 550 and the elevator rod 510 moving upwards with the restoring force, further bringing the shelter 20 to rotate above on the connector 120, and the shelter 20 is automatic resetting.

Figure 5:
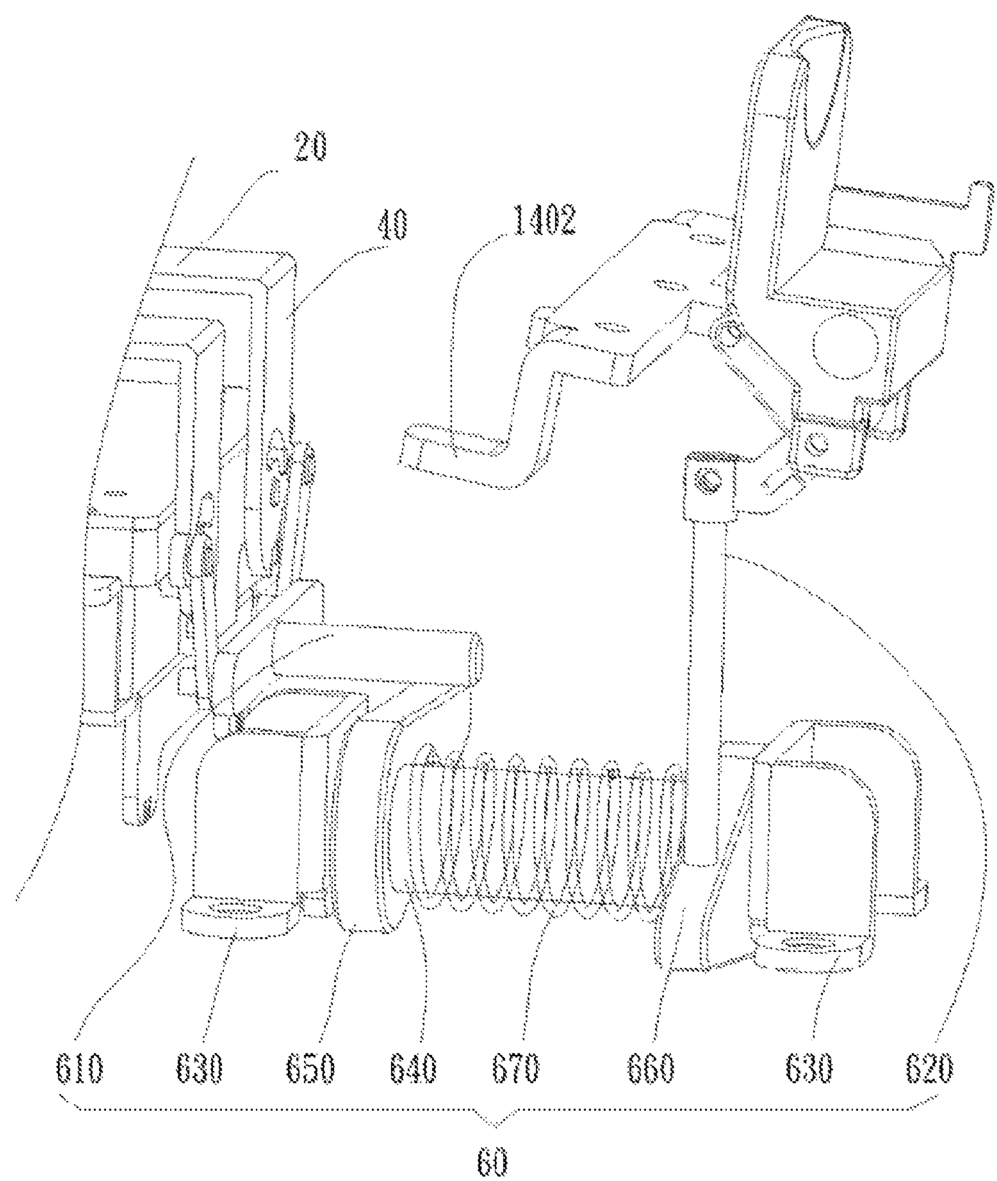
FIG. 5 is an isometric view of a second link mechanism in FIG. 2.

FIG. 5 shows an exemplary embodiment of the second link mechanism 60. In the exemplary embodiment, the second link mechanism 60 includes a second link shaft 610, an eccentric wheel device and a push rod 620. The second link shaft 610 with a second link shaft first end vertically connected to the second link member 40 and moves up and down with the rotation of the second link member 40. The eccentric wheel device is driven by a free end of the second link shaft 610 moved up and down. The push rod 620 with a push rod first end is pushed by the eccentric wheel device, a push rod second end is connected to the movable latch 140 and switched in locked and unlocked states. When the push rod 620 is pushed to upwards by the eccentric wheel device, the movable latch 140 is locked. In contrast, when the push rod 620 is pushed to downwards, the movable latch 140 is unlocked.

In the specific exemplary embodiment, the eccentric wheel device includes a bearing seat 630 mounted on the base 110, a cam shaft 640 is mounted on the bearing seat 630 and a first cam 650 is mounted on a camshaft first end. The first cam 650 having an first cam outer edge upper portion is in tangential contact with the second link shaft 610. A second cam 660 is mounted on a cam shaft second end, the second cam 660 having an second cam outer edge upper portion is in tangential contact with a push rod lower portion.

When the second link shaft 610 is moved downward, the first cam 650 is forced to bring the cam shaft 640 to rotate downwardly, the cam shaft 640 drives the second cam 660 to rotate to make the push rod 620 upwards to have the movable latch 140 switched from unlocked state to locked state, thereby the mobile terminal 1 is locked.

As an exemplary embodiment, the eccentric wheel assembly may further include a torsion spring 670 on the cam shaft 640, the torsion spring 670 has two torsion arms on two ends, one of the two torsion arms is mounted on the base 110, the other of the two torsion arms is mounted on the first cam 650.

When the second link shaft 610 drives the movable latch 140 into lock through the eccentric wheel device and the push rod 620, the torsion spring 670 is deformed. When the second link shaft 610 is free, the torsion spring 670 drives the eccentric wheel device back to the initial position with the restoring force and the movable latch 140 into unlock. It will be appreciated that the torsion spring 670 with a torsion spring first end is mounted on the base 110 and the torsion arm at a torsion spring second end can also be secured to the second cam 660 which only needs to satisfy the restoring force which provides the reset for driving the eccentric wheel means.

Figure 6:
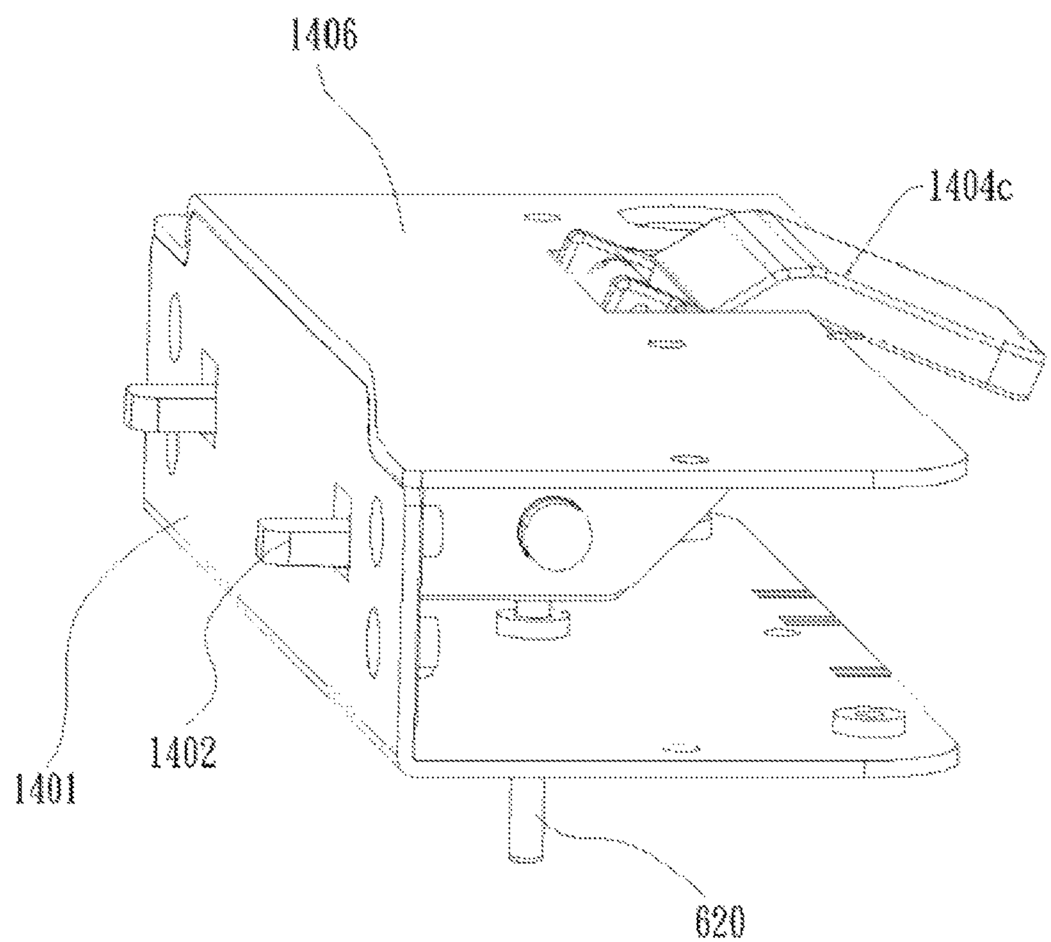
FIG. 6 is an isometric view of a movable latch in FIG. 2.
Figure 7:
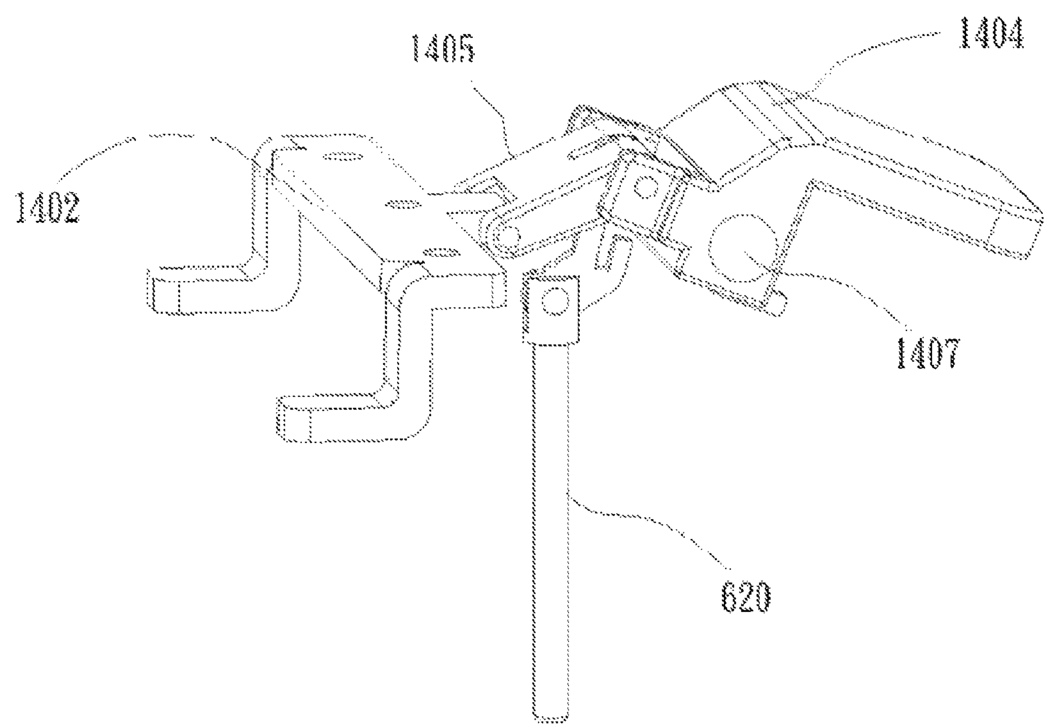
FIG. 7 is an isometric view of part of the movable latch in FIG. 6.
Figure 8:
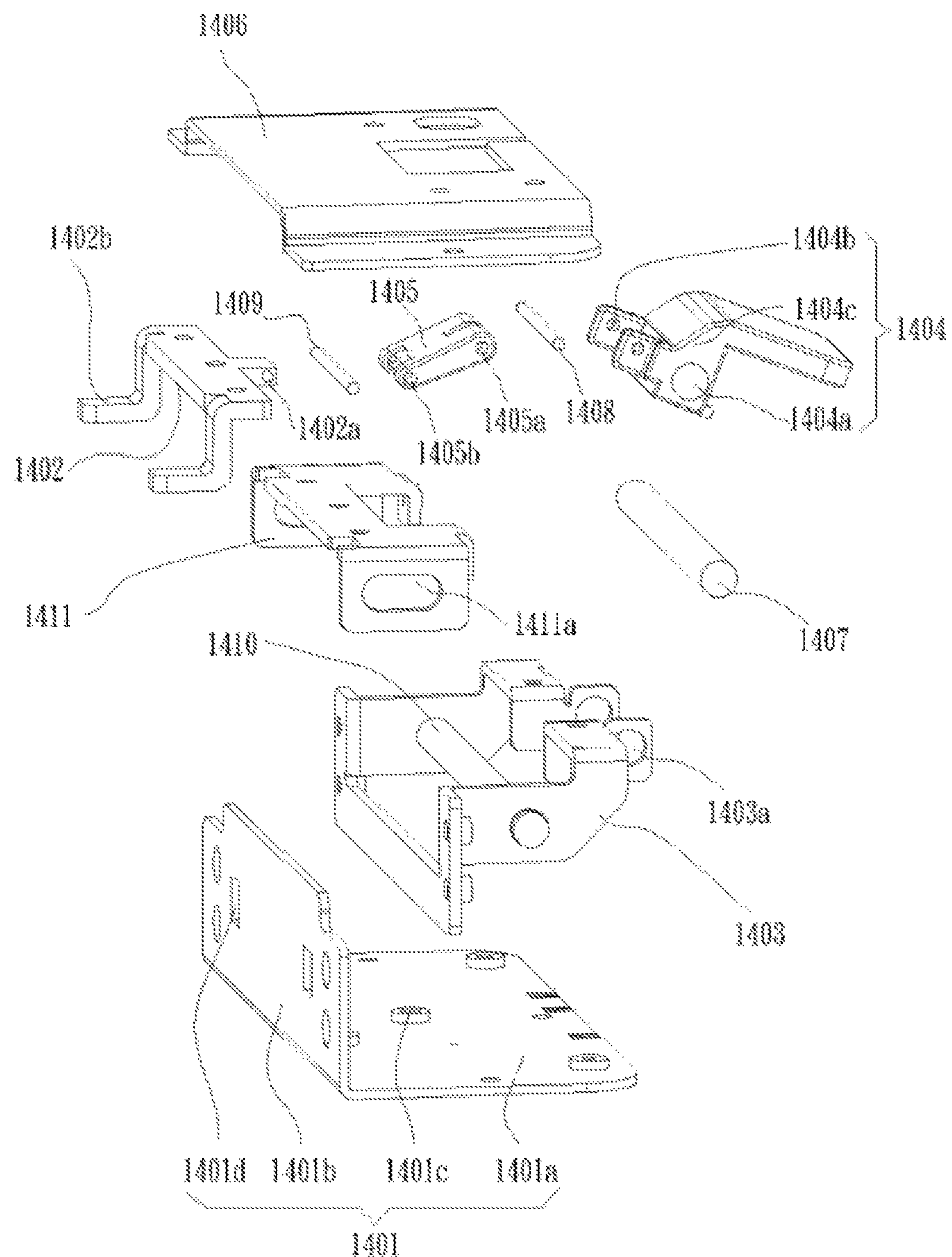
FIG. 8 is an exploded isometric view of FIG. 6.

FIGS. 6 to 8 show an exemplary embodiment of the movable latch 140. In the particular exemplary embodiment, the movable latch 140 is mounted on the base 110 through a stop plate 1401. The stop plate 1401 comprises a bottom plate 1401*a* mounted on the base 110 and a side plate 1401*b* vertically connected with the bottom plate 1401*a*. The side plate 1401*b* is in contact with a mobile terminal side surface. In the particular exemplary embodiment, the stop plate 1401 on upper portion has a top cover 1406 parallel to the bottom plate 1401*a*. The bottom plate 1401*a* and a predetermined position of the base 110 has a through hole 1401*c* corresponding to the push rod 620. The push rod 620 can be moved up and down through the through hole 1401*c*, while the through hole 1401*c* serves as a guide for the push rod 620 to move up and down. The movable latch 140 comprises at least a movable latch buckle 1402*b* for engaging with the mobile terminal 1, and a keyhole 1401*d* on the side plate 1401*b* corresponding to the movable latch buckle 1402*b*.

When the movable latch buckle 1402*b* is promoted by the push rod 620, the movable latch buckle 1402*b* stretches out from the keyhole 1401*d*, the movable latch buckle 1402*b* clips the mobile terminal 1 for locking the movable latch 140. When the movable latch buckle 1402*b* is retracted from the keyhole 1401*d*, the mobile terminal 1 is release for unlocking the movable latch 140.

In an exemplary embodiment, the movable latch 140 includes a guide seat 1403, a rotatable member 1404, a transmission member 1405 and a clip member 1402. The guide seat 1403 includes a fastened end mounted on the side plate and an external end extends to the bottom plate 1401*a* up position. The rotatable member 1404 with a rotatable member first end rotatably connected to the external end of the guide seat 1403. The clip member 1402 with a clip member first end has a movable latch buckle 1402*b*. The transmission member 1405 has a transmission member first end and a transmission member second end separately connected with the rotatable member 1404 and a clip member second end.

The push rod 620 with a push rod upper end is connected with the transmission member 1405, and further promotes the rotatable member 1404 rotate along with a guide seat external end. The rotatable member 1404 drags a clip member rotatable end to up and down through the transmission member 1405, further drags the movable latch buckle 1402*b* extended or retracted from the keyhole 1401*d*.

In an exemplary embodiment, a slide shaft 1410 parallel to the side plate 1401*b* and the bottom plate 1401*a* is secured to the guide seat external end. A guide block 1411 is secured under the clip member 1402. The guide block 1411 has a lug hole 1411*a* along with the direction of extended or retracted from the movable latch buckle 1402*b*.

When the clip member rotatable end moves up and down, a guide block lower portion slides with respect to the slide shaft 1410 guided by the lug hole 1411*a*, and the clip member 1402 is extended or retracted from the keyhole 1401*d*. The slide shaft 1410 is mounted on the guide seat 1403 to support the clip member 1402.

In an exemplary embodiment, the guide seat external end has a first shaft hole 1403*a* parallel to the side plate 1401*b* and the bottom plate 1401*a*. The rotatable member 1404 with the rotatable member first end has a second shaft hole 1404*a*, and a third shaft hole 1404*b* on a rotatable member second end, the second shaft hole 1404*a* is rotatably connected with the first shaft hole 1403*a* through the first rotate shaft 1407. The transmission member 1405 with the transmission member first end has a fourth shaft hole 1405*a*, and the transmission member second end has a fifth shaft hole 1405*b*, the fourth shaft hole 1405*a* is rotatably connected with the third shaft hole 1404*b* through the second rotate shaft 1408. The clip member 1402 with the clip member first end has a sixth shaft hole 1402*a*, and the movable latch buckle 1402*b* is on the clip member second end, the sixth shaft hole 1402*a* is rotatably connected with the fifth shaft hole 1405*b* through the third rotate shaft 1409. The push rod upper end is rotatably connected with the second rotate shaft 1408.

The rotatable member 1404 with the rotatable member first end is rotatably connected to the guide seat external end by the first rotate shaft 1407. When the push rod 620 promotes the second rotate shaft 1408, the rotatable member first end rotates with the first rotate shaft 1407, the rotatable member second end moves up and down promoted by the push rod 620. The push rod 620 promotes the rotatable member second end moved up and down. The push rod 620 simultaneously promotes the transmission member first end synchronously moved up and down. The rotatable member 1404 with the rotatable member first end rotatably connected to the transmission member 1405 rotates with the first rotate shaft 1407 to form a horizontal displacement to make the horizontal distance between the transmission member second end and the first rotate shaft 1407 elongated or shortened so as to drag the clip member 1402 connected with the transmission member 1405, and further brings the movable latch buckle 1402*b* extended or retracted from the keyhole 1401*d*.

In an exemplary embodiment, the rotatable member first end close to the second shaft hole 1404*a* extends to form a handle 1404*c*, when the mobile terminal 1 is removed, the handle 1404*c* is moved to have the movable latch buckle 1402*b* retracted from the keyhole 1401*d*, and the movable latch 140 is unlocked.

In the exemplary embodiment of the docking station 2, the shelter 20 is disposed on the connector 120 to prevent the connector 120 from damaged because of scratch. Besides, the mobile terminal 1 is inserted into the docking station 2 only by the positioning clip 130. The shelter 20 is opened, and the movable latch 140 is locked with the gravity of the mobile terminal 1 itself without any other operation. After the removal of the mobile terminal 1, the docking station 2 can automatically return to the originally state before the mobile terminal 1 is put in place by the restoring force of the first elastic member 560 and the second elastic member 340.

Figure 9:
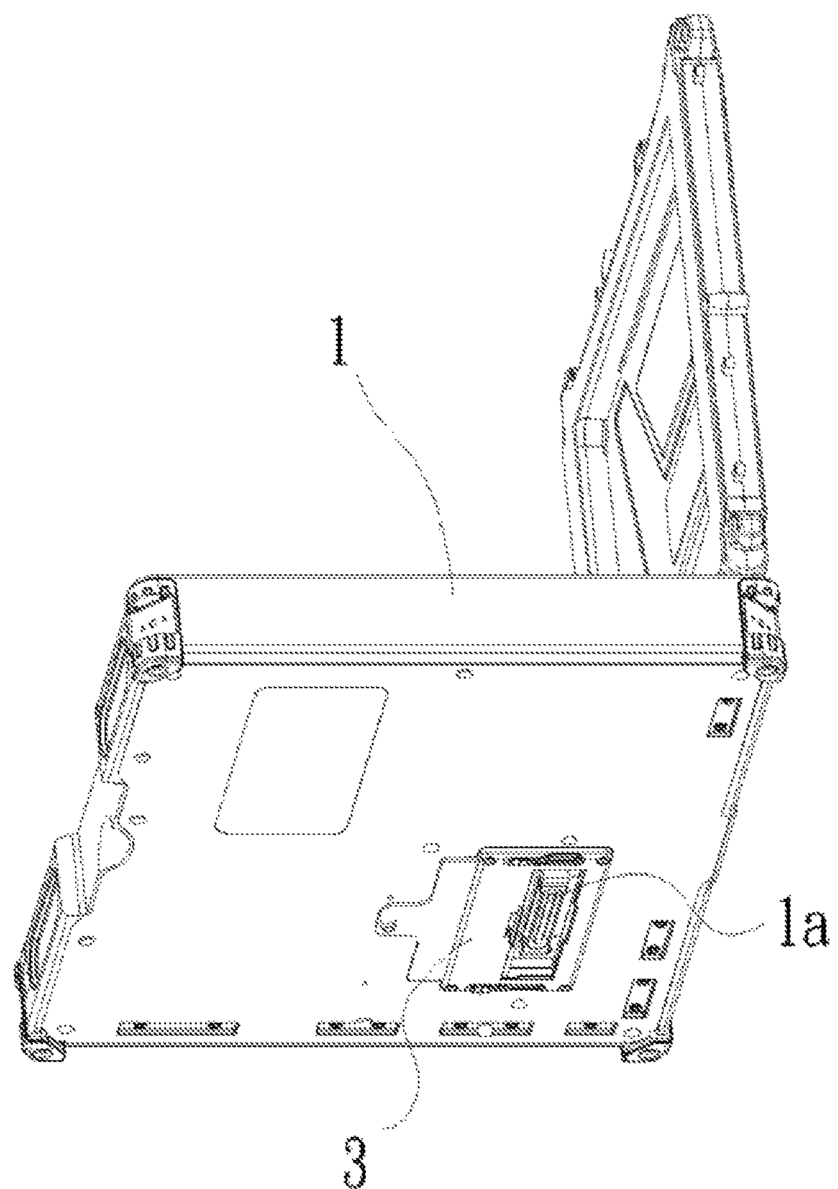
FIG. 9 is an isometric view of an assembled structure of an exemplary embodiment of a mobile terminal and a detent device.

Referring to FIG. 1 and FIG. 9, the exemplary embodiment shows a mobile terminal 1 having a docking station 2. In a specific exemplary embodiment, the mobile terminal 1 having a docking station 2 includes a mobile terminal 1 and a docking station 2, wherein the docking station 2 may be one of the docking stations described in the above-described embodiment. The mobile terminal 1 includes a mobile terminal connection interface 1*a*, and the mobile terminal connection interface 1*a* on the mobile terminal 1 is electrically connected to the docking station 2. The mobile terminal connection interface 1*a* may be provided on a mobile terminal lower end surface for convenience of use with the docking station 2.

In an exemplary embodiment, a defend device 3 is slidably connected to the mobile terminal connection interface 1*a*. When the mobile terminal 1 is assembled on the docking station 2, the defend device 3 with slide movement makes the mobile terminal connection interface 1*a* exposed out. When the mobile terminal 1 is disassembled from the docking station 2, the defend device 3 with slide movement makes the mobile terminal connection interface 1*a* closed.

Figure 10:
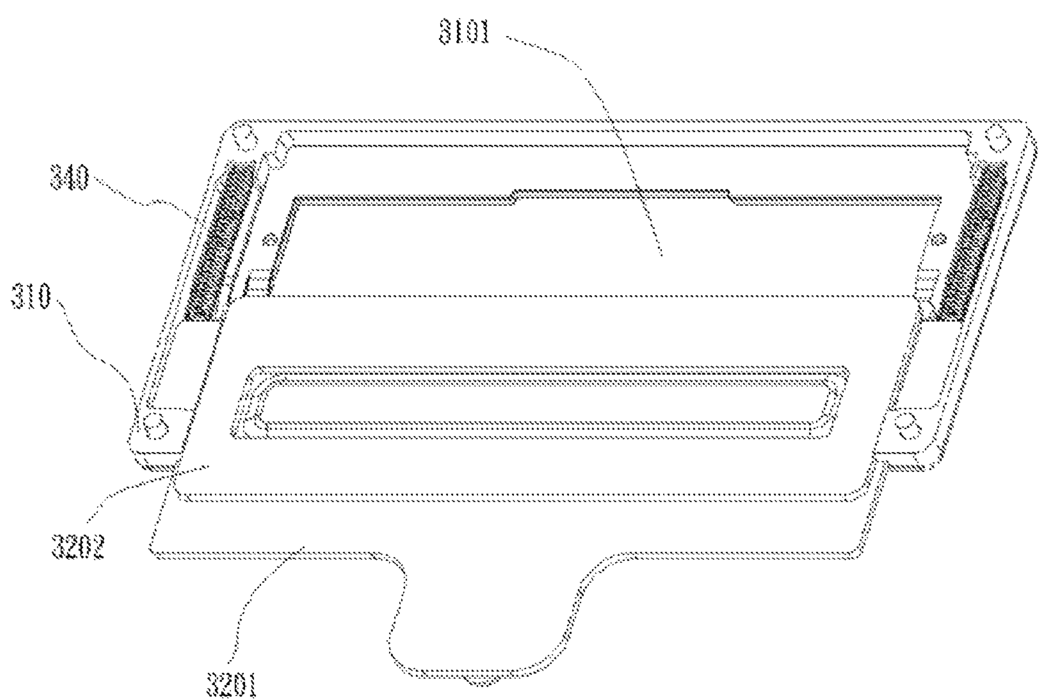
FIG. 10 is an isometric view of the detent device in FIG. 9.
Figure 11:
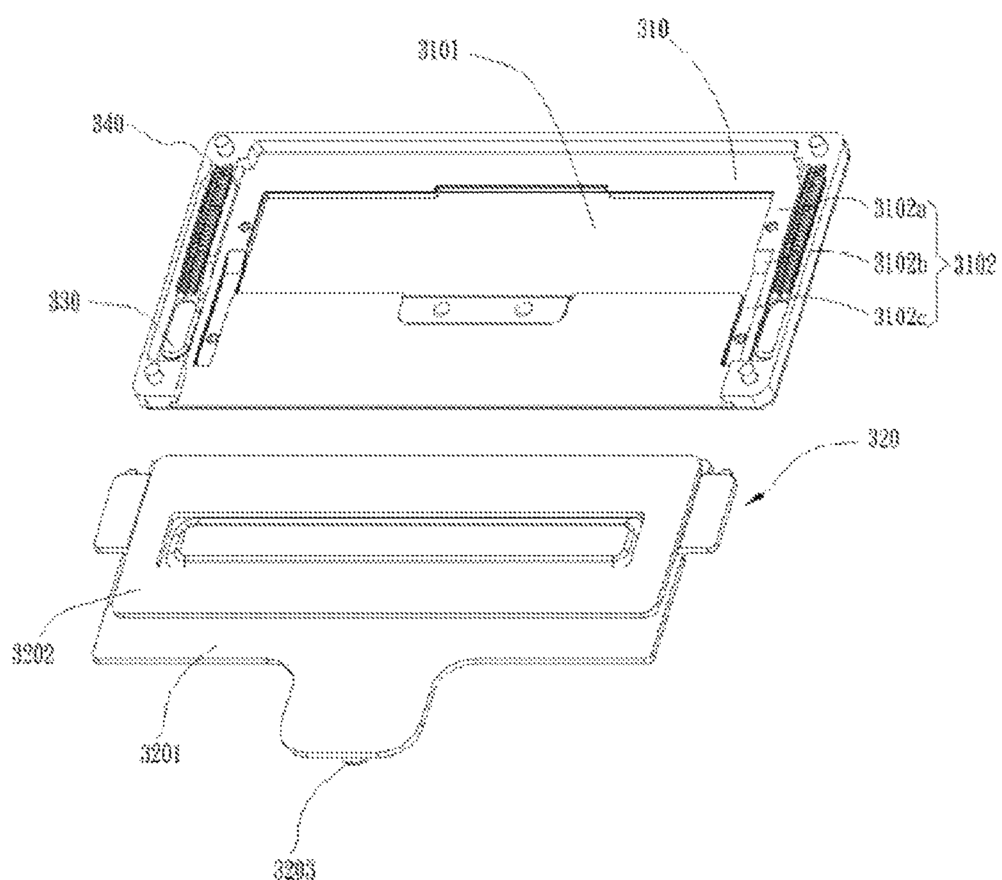
FIG. 11 is an exploded isometric view of FIG. 10.
Figure 12:
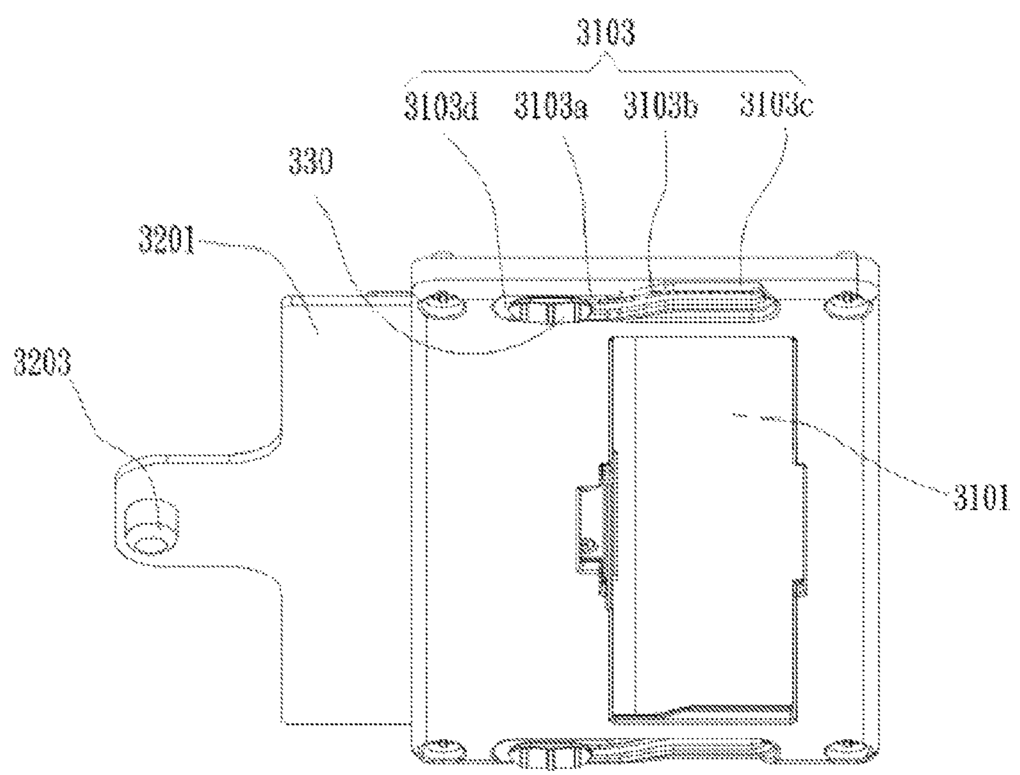
FIG. 12 is a bottom plan view of FIG. 10.

Referring to FIG. 10 to FIG. 12, in the exemplary embodiment, the defend device 3 comprises a shell 310, a defend wall 320 and a locking device 330. The shell 310 is mounted on outside of the mobile terminal connection interface 1*a*. For example, a plurality of screw holes may be provided on the periphery of the mobile terminal connection interface 1*a* and the edge of the shell 310, and the shell 310 is mounted on the mobile terminal 1 by screws. The shell 310 has an opening 3101 corresponding to the mobile terminal connection interface 1*a*. the shell 310 having a shell first side and a shell second side has a first slide rail 3102 and a second slide rail 3103 parallel to the first slide rail 3102. As an exemplary embodiment, the first slide rail 3102 and the second slide rail 3103 are provided on the shell first side and the shell second side. The defend wall 320 is slidably connected to the first slide rail 3102 on both sides, the opening 3101 is closed or opened through sliding the defend wall 320. Thereby closing or opening the mobile terminal connection interface 1*a*. The locking device 330 is on the second slide rail 3103 and in contact with a defend wall corresponding side for tightening or loosing the defend wall 320.

When the mobile terminal 1 is disassembled from the docking station 2, the defend wall 320 closes the opening 3101 while the locking device 330 presses the defend wall 320 to tightly close the mobile terminal connection interface 1*a*. When the mobile terminal 1 is assembled on the docking station 2, the locking device 330 is released, and the defend wall 320 is slid to open the opening 3101.

Referring to FIG. 11 to FIG. 12, in the exemplary embodiment, the defend wall 320 includes a push door 3201 and an elastic seal pad 3202. The push door 3201 is slidably blocked with the first slide rail 3102 on both sides. The elastic seal pad 3202 is mounted on the push door 3201 closed to the mobile terminal 1. The first slide rail 3102 has a first slide section 3102*a* and a second slide section 3102*c*, the distance of the second slide section 3102*c* and the mobile terminal connection interface 1*a* is smaller than the distance of the first slide section 3102*a* and the mobile terminal connection interface 1*a*. The first slide section 3102*a* is connected with the second slide section 3102*c* through a first slope surface 3102*b*.

When the push door 3201 is sliding from the first slide section 3102*a* to the second slide section 3102*c* to close the opening 3101, the push door 3201 and the elastic seal pad 3202 abuts towards to the mobile terminal connection interface 1*a* to make the elastic seal pad 3202 press to seal. In the exemplary embodiment, the elastic seal pad 3202 may be a rubber pad.

As a exemplary embodiment, a defend wall front end sliding side is connected with the first slide rail end through a second elastic member 340. When the defend wall 320 is forced by an external force to close the opening 3101, the second elastic member 340 is deformed with the sliding of the defend wall 320, and the defend wall 320 is pressed by the locking device 330 after reaching the predetermined position. When the defend wall 320 is released from the locking device 330, the defend wall 320 is automatically opened by the second elastic member 340 with restoring force.

Referring to FIG. 12, in the exemplary embodiment, the locking device 330 includes an elastic block. The second slide rail 3103 has a third slide section 3103*a* and a fourth slide section 3103*c*. The distance of the fourth slide section 3103*c* and the defend wall 320 is smaller than the distance of the third slide section 3103*a* and the defend wall 320. The third slide section 3103*a* is connected with the fourth slide section 3103*c* through a second slope surface 3103*b*. An elongated hole 3103*d* on the middle of the second slide rail 3103 extends from the third slide section 3103*a* to the fourth slide section 3103*c*. The elastic block is slidably connected into the elongated hole 3103*d*, an elastic block first side is jointed with the defend wall 320, an elastic block second side has a push portion.

When it is necessary to press the defend wall 320, the push portion is pushed, The elastic block is pushed from the third slide section 3103*a* to the fourth slide section 3103*c* along with the elongated hole 3103*d*. Since the distance of the fourth slide section 3103*c* and the defend wall 320 is smaller than the distance of the third slide section 3103*a* and the defend wall 320. When the elastic block is pushed from the third slide section 3103*a* to the fourth slide section 3103*c*, the elastic block abuts towards to the defend wall 320, and the elastic block first side pressed tightly with the defend wall 320. Similarly, the elastic block is pushed in the opposite direction to release the defend wall 320.

As an exemplary embodiment, a positioning lever 3203 on the defend device lower potion is connected with the first link mechanism 50. The positioning lever 3203 is contacted with the first link mechanism first end to drive the first link mechanism 50 before the mobile terminal 1 is assembled with the docking station 2.

The exemplary embodiments show a mobile terminal 1 with the docking station 2. It is not only with a simple process for assembling and easy-to-use, but also improves the waterproof and dustproof performance of the mobile terminal 1 by the defend device 3.

The exemplary embodiments shown and described above are only examples. Many details are often found in the art such as the other features of case with device for tool free unlocking access. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A docking station electrically connected to a mobile terminal, comprising: a main body including a base, a connector formed on the base, a positioning clip connected to a base upper side, and a movable latch mounted on the base relative to the positioning clip; a shelter having a shelter first side and a shelter second side separately and rotatably connected to a connector first side and a connector second side by a link member; a first link mechanism with a first link mechanism first end connected to a link member first side and driving the link member to rotate, and a first link mechanism second end in contact with the mobile terminal and driven by the gravity of the mobile terminal in a working station; and a second link mechanism with a second link mechanism first end connected to a link member second side and driving the link member to rotate, and a second link mechanism second end connected to the movable latch and drives the movable latch switched in lock and unlock states, wherein: when the docking station is not connected to the mobile terminal, the shelter is above the connector to prevent the connector from damaged because of scratch, and the movable latch is in the unlock state, when the mobile terminal is placed in the docking station, the first link mechanism drives the link member to rotate under the gravity of the mobile terminal, and the link member drives the shelter to rotate to a predetermined receiving position, the mobile terminal is electrically connected to the connector exposed, the second link mechanism is locked with the movable latch, the mobile terminal is locked by the positioning clip and the movable latch together.

2. The docking station of claim 1, wherein the base comprises:

a first support plate;

a second support plate disposed below the first support plate in parallel;

a plurality of support legs under the second support plate for supporting; and a plurality of support rods connected between the first support plate and the second support plate.

3. The docking station of claim 2, wherein the first link mechanism and the second link mechanism are disposed between the first support plate and the second support plate, the connector is fastened on a first support plate upper portion, a contact member is disposed on a first link mechanism first side, and the contact member extends from a contact hole on the first support plate and through the contact hole to touch with the mobile terminal.

4. The docking station of claim 3, further comprising an elastic washer on the first support plate upper portion, the elastic washer is around the connector.

5. The docking station of claim 1, wherein the first link mechanism comprises:

an elevator rod, the elevator rod having an elevator rod upper end contacted with the mobile terminal and driven by the gravity of the mobile terminal;

a first link shaft with a first link shaft first end vertically connects to the elevator rod;

a rocker with a rocker first end connected to a first link shaft second end, and a rocker second end hinged to a link member first end; and wherein the base has a sliding hole engaged with an elevator rod bottom end, when the elevator rod is moved downward, the elevator rod drives the first link shaft to fall, the first link shaft drives the rocker to swing, and the rocker promotes the link member to rotate to bring the shelter to rotate to the predetermined receiving position.

6. The docking station of claim 5, wherein the link member comprises a first link member coupled with the shelter first end and a second link member coupled with the shelter second end; the first link mechanism first end is connected to the first link member and drives the first link member to rotate; the second link mechanism first end is connected to the second link member and drives by the second link member.

7. The docking station of claim 6, wherein the middle of the first link member has a sliding slot to engage with a sliding block on the connector first side, when the rocker promotes the first link member to rotate, the sliding block is moved along with the sliding slot.

8. The docking station of claim 5, wherein the first link mechanism comprises a baffle vertically passed through by the elevator rod and secured with the elevator rod, and the first link shaft first end is vertically connected with the elevator rod through the baffle; a first elastic member is placed over the elevator rod and is buckled between the baffle and a base upper portion; when the mobile terminal is assembled to the docking station, the elevator rod drives the baffle moving downward, and the shelter rotates to the predetermined receiving position, the first elastic member is compressed; when the mobile terminal is disassembled from the docking station, the first elastic member drives the baffle and the elevator rod moving upwards with a restoring force, further bringing the shelter to rotate above on the connector.

9. The docking station of claim 1, wherein the second link mechanism comprises a second link shaft with a second link shaft first end vertically connected to the link member and moves up and down with the rotation of the link member; an eccentric wheel device is driven by a free end of the second link shaft moved up and down; a push rod with a push rod first end is pushed by the eccentric wheel device, a push rod second end is connected to the movable latch switched in locked and unlocked states.

10. The docking station of claim 9, wherein the eccentric wheel device comprises a bearing seat mounted on the base, a cam shaft mounted on the bearing seat, and a first cam mounted on a cam shaft first end; the first cam having a first cam outer edge upper portion is in tangential contact with the second link shaft; a second cam is mounted on a cam shaft second end, the second cam having a second cam outer edge upper portion is in tangential contact with a push rod lower portion; when the second link shaft is moved downward, the first cam is forced to bring the cam shaft to rotate, the cam shaft drives the second cam to rotate to make the push rod working to have the movable latch switched from unlocked to locked states.

11. The docking station of claim 10, wherein:

the eccentric wheel device further comprises a torsion spring on the cam shaft, the torsion has two torsion arms on two ends, one of the two torsion arms is mounted on the base, the other of the two torsion arms is mounted on the first cam;

when the second link shaft drives the movable latch into lock through the eccentric wheel device and the push rod, the torsion spring is deformed; and when the second link shaft is free, the torsion spring drives the eccentric wheel device back to an initial position with a restoring force and the movable latch into unlock.

12. The docking station of claim 9, wherein the movable latch is mounted on the base through a stop plate, the stop plate comprises a bottom plate mounted on the base and a side plate vertically connected with the bottom plate, the bottom plate and a predetermined position of the base has a through hole corresponding to the push rod, the movable latch comprises at least a movable latch buckle for engaging with the mobile terminal, and a keyhole on the side plate corresponding to the movable latch buckle;

when the push rod promotes the movable latch buckle stretched out from the keyhole, the movable latch buckle clips the mobile terminal for locking the movable latch; when the movable latch buckle is retracted from the keyhole, the mobile terminal is release for unlocking the movable latch.

13. The docking station of claim 12, wherein the movable latch further comprises a guide seat having a fastened end mounted on the side plate and a guide seat external end extends to the bottom plate up position; a rotatable member with a rotatable member first end rotatably connected to the guide seat external end; a clip member with a first end has the movable latch buckle; a transmission member has a transmission member first end and a transmission member second end separately connected with the rotatable member and a clip member second end; the push rod is connected with the transmission member, and further promotes the rotatable member rotate along with the guide seat external end, the rotatable member drags a clip member rotatable end to up and down through the transmission member, further drags the movable latch buckle extended or retracted from the keyhole.

14. The docking station of claim 13, wherein a slide shaft parallel to the side plate and the bottom plate is secured on the guide seat external end, a guide block is secured under the clip member, the guide block has a lug hole along with one direction of extended or retracted from the movable latch buckle; when the clip member rotatable end moves up and down, a guide block lower potion is slide with respect to the slide shaft guided by the lug hole, and the clip member is extended or retracted from the keyhole.

15. The docking station of claim 13, wherein the guide seat external end has a first shaft hole parallel to the side plate and the bottom plate; the rotatable member with the rotatable member first end has a second shaft hole, and a third shaft hole on a rotatable member second end, the second shaft hole is rotatably connected with the first shaft hole through the first rotate shaft; the transmission member with the transmission member first end has a fourth shaft hole, and the transmission member second end has a fifth shaft hole, the fourth shaft hole is rotatably connected with the third shaft hole through the second rotate shaft; the clip member with the first end has a sixth shaft hole, the movable latch buckle is on the clip member second end, the sixth shaft hole is rotatably connected with the fifth shaft hole through the third rotate shaft; a push rod upper end is rotatably connected with the second rotate shaft.

16. The docking station of claim 15, wherein the rotatable member first end close to the second shaft hole extends to form a handle, when the mobile terminal is removed, the handle is moved to have the movable latch buckle retracted from the keyhole, and the movable latch is unlocked.

17. The mobile terminal with the docking station, comprising: a mobile terminal connection interface on the mobile terminal and the docking station in claim 1, the mobile terminal connection interface is electrically connected to the docking station.

18. The mobile terminal of claim 17, wherein a defend device is slidably connected to the mobile terminal connection interface; when the mobile terminal is assembled on the docking station, the defend device with slide movement makes the mobile terminal connection interface exposed out; when the mobile terminal is disassembled from the docking station, the defend device with slide movement makes the mobile terminal connection interface closed.

19. The mobile terminal of claim 17, wherein the defend device comprises a shell mounted on outside of the mobile terminal connection interface, the shell has an opening corresponding to the mobile terminal connection interface, the shell with a shell first side and a shell second side has a first slide rail and a second slide rail parallel to the first slide rail; a defend wall is slidably connected to the first slide rail on both sides, the opening is closed or opened through sliding the defend wall; a locking device is on the second slide rail and in contact with a defend wall corresponding side for tightening or loosing the defend wall.

20. The mobile terminal of claim 19, wherein the defend wall comprises a push door slidably blocked with the first slide rail on both sides and an elastic seal pad mounted on the push door closed to the mobile terminal; the first slide rail has a first slide section and a second slide section, a distance of the second slide section and the mobile terminal connection interface is smaller than a distance of the first slide section and the mobile terminal connection interface, the first slide section is connected with the second slide section through a first slope surface; when the push door is sliding from the first slide section to the second slide section to close the opening, the push door and the elastic seal pad abuts towards to the mobile terminal connection interface to make the elastic seal pad press to seal.

21. The mobile terminal of claim 19, wherein the locking device comprises an elastic block, the second slide rail has a third slide section and a fourth slide section, a distance of the fourth slide section and the defend wall is smaller than a distance of the third slide section and the defend wall, the third slide section is connected with the fourth slide section through a second slope surface; an elongated hole on the middle of the second slide rail extends from the third slide section to the fourth slide section, the elastic block is slidably connected into the elongated hole, the elastic block first side is jointed with the defend door, the elastic block second side has a push portion; when the elastic block is pushed from the third slide section to the fourth slide section, the elastic block abuts towards to the defend wall and releasing the defend wall in a reverse direction of external force.

22. The mobile terminal of claim 19, wherein a defend wall front end sliding side is connected with a first slide rail first end through a second elastic member; when the defend wall is forced by an external force to close the opening, the second elastic member is deformed with the sliding of the defend wall, and the defend wall is pressed by the locking device after reaching the predetermined receiving position; when the defend wall is released from the locking device, the defend wall is automatically opened by the second elastic member with restoring force.

23. The mobile terminal of claim 18, wherein a positioning lever on a defend device lower potion is connected with the first link mechanism, the positioning lever is contacted with the first link mechanism first end to drive the first link mechanism before the mobile terminal is assembled with the docking station.

* * * * *